United States Patent [19]

Nishikawa et al.

[11] Patent Number: 5,341,980

[45] Date of Patent: Aug. 30, 1994

[54] METHOD OF FABRICATING ELECTRONIC CIRCUIT DEVICE AND APPARATUS FOR PERFORMING THE SAME METHOD

[75] Inventors: Toru Nishikawa, Fujisawa; Ryohei Satoh, Yokohama; Masahide Harada, Fujisawa; Tetsuya Hayashida, Tokyo; Mitugu Shirai, Hatano, all of Japan

[73] Assignee: Hitachi, Ltd., Tokyo, Japan

[21] Appl. No.: 890,255

[22] Filed: May 29, 1992

Related U.S. Application Data

[63] Continuation-in-part of Ser. No. 656,465, Feb. 19, 1991, abandoned.

[30] Foreign Application Priority Data

Feb. 19, 1990 [JP] Japan .................. 2-36033

[51] Int. Cl.$^5$ .............................................. B23K 31/02
[52] U.S. Cl. ................... 228/205; 228/180.21; 228/219
[58] Field of Search ............ 228/206, 207, 205, 180.2, 228/219, 220, 180.21, 180.22

[56] References Cited

U.S. PATENT DOCUMENTS

| | | | |
|---|---|---|---|
| 4,379,218 | 4/1983 | Grebe | 228/205 |
| 4,865,245 | 9/1989 | Schulte | 228/205 |
| 4,921,157 | 5/1990 | Dishon | 228/220 |
| 4,979,664 | 12/1990 | Lyons | 228/180.2 |
| 5,115,964 | 5/1992 | Ameen et al. | 228/180.2 |

FOREIGN PATENT DOCUMENTS

| | | | |
|---|---|---|---|
| 1169166 | 7/1986 | Japan | 228/205 |
| 1544201 | 4/1979 | United Kingdom | 228/205 |

OTHER PUBLICATIONS

*Improvement in Solderability By Laser Irradiation*, International Tech. Discl. vol. 10 No. 8, Aug. 1992.

Primary Examiner—P. Austin Bradley
Assistant Examiner—James Miner
Attorney, Agent, or Firm—Antonelli, Terry, Stout & Kraus

[57] ABSTRACT

In a method of soldering for use in fabricating electronic circuit device, after an oxide layer and/or contaminated layer on a surface of a soldering material and members to be soldered thereby is removed by sputter-cleaning with atom or ion, the members are aligned in an oxidizing atmosphere within a predetermined time period and, then, the soldering material is heated in non-oxidizing atmosphere to performe soldering. An apparatus for performing the above method comprises a sputter cleaning device, an alignment device operable in atmospheric condition and a heating and soldering device in the form of a belt furnace operable in non-oxidizing or reducing environment. Instead of the sputter cleaning device, a mechanical polishing or cutting device can be used to cleaning a surface of solder or a member to be bonded or a solder ball plated with gold may be used. An alignment between two members to be bonded is provided by an alignment mark means which comprises a protrusion on a surface of one member and a complimental recess formed at a center portion of a protrusion means formed on a corresponding surface of the other member.

34 Claims, 14 Drawing Sheets

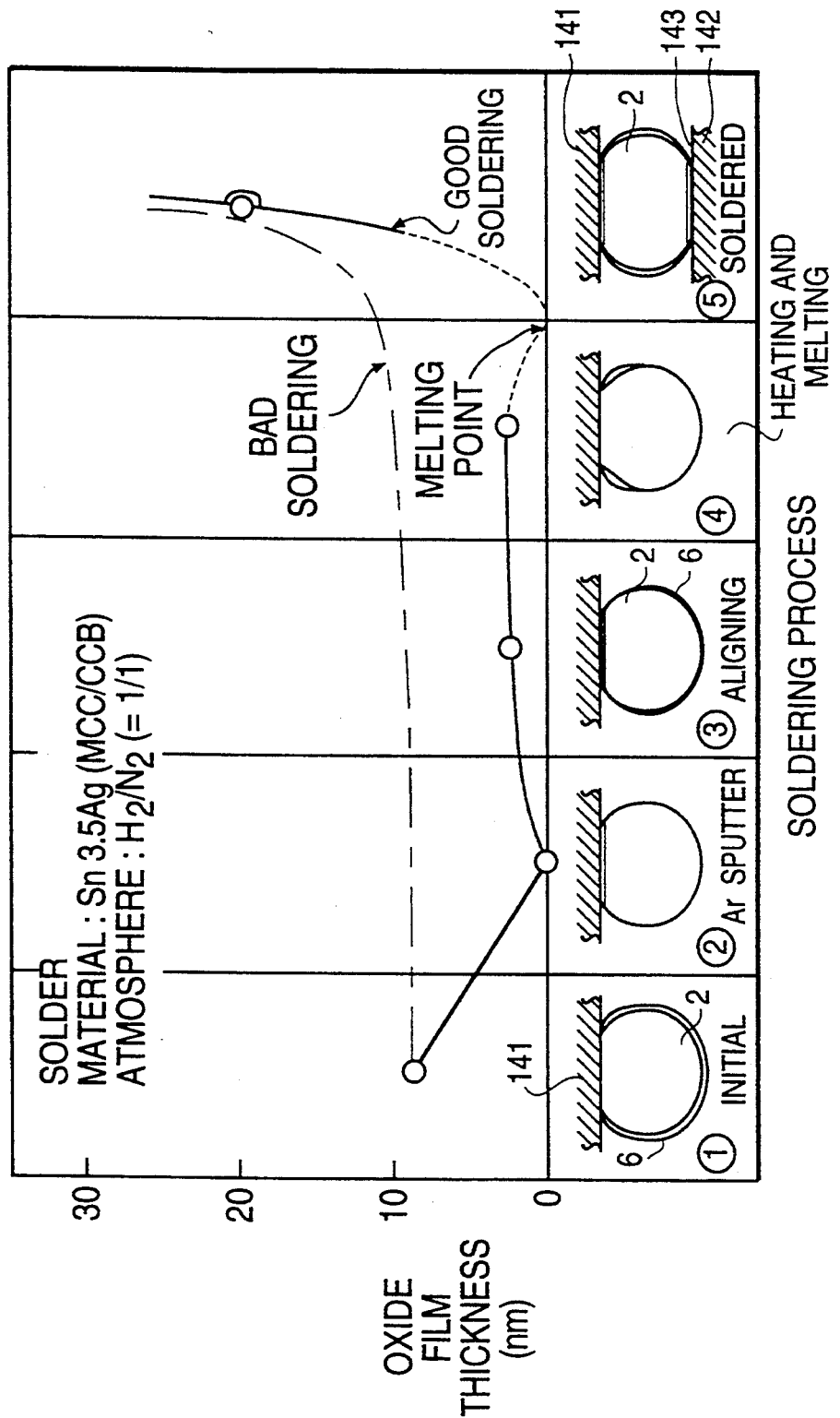

FIG. 13
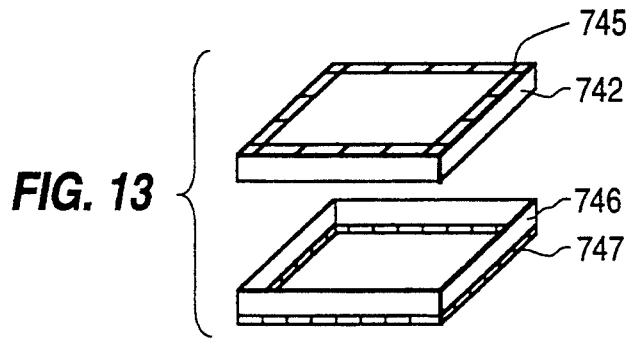
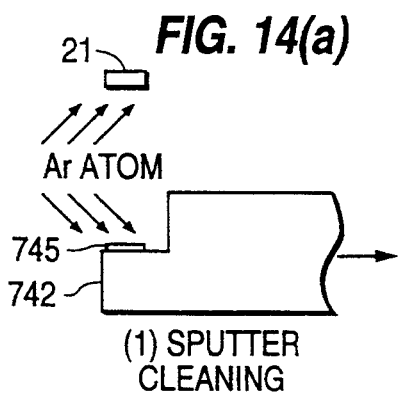
(1) SPUTTER CLEANING
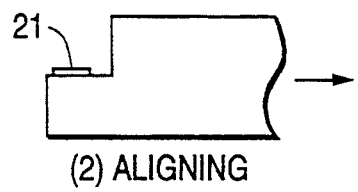
(2) ALIGNING
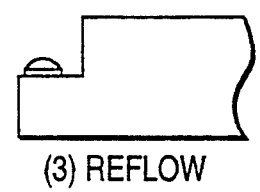
(3) REFLOW
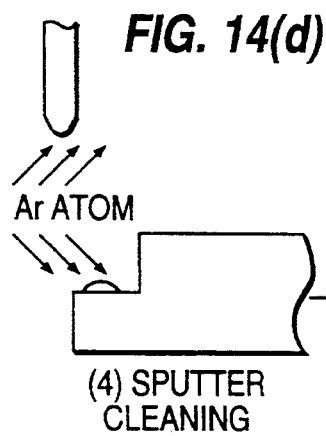
(4) SPUTTER CLEANING
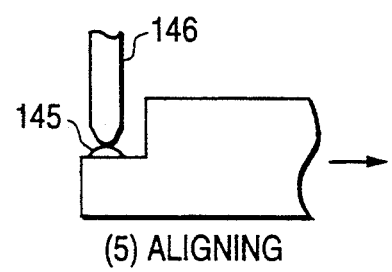
(5) ALIGNING
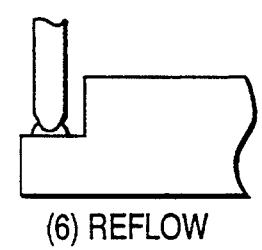
(6) REFLOW
FIG. 15
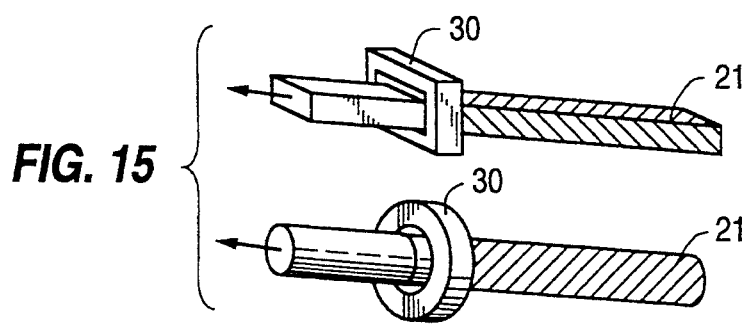

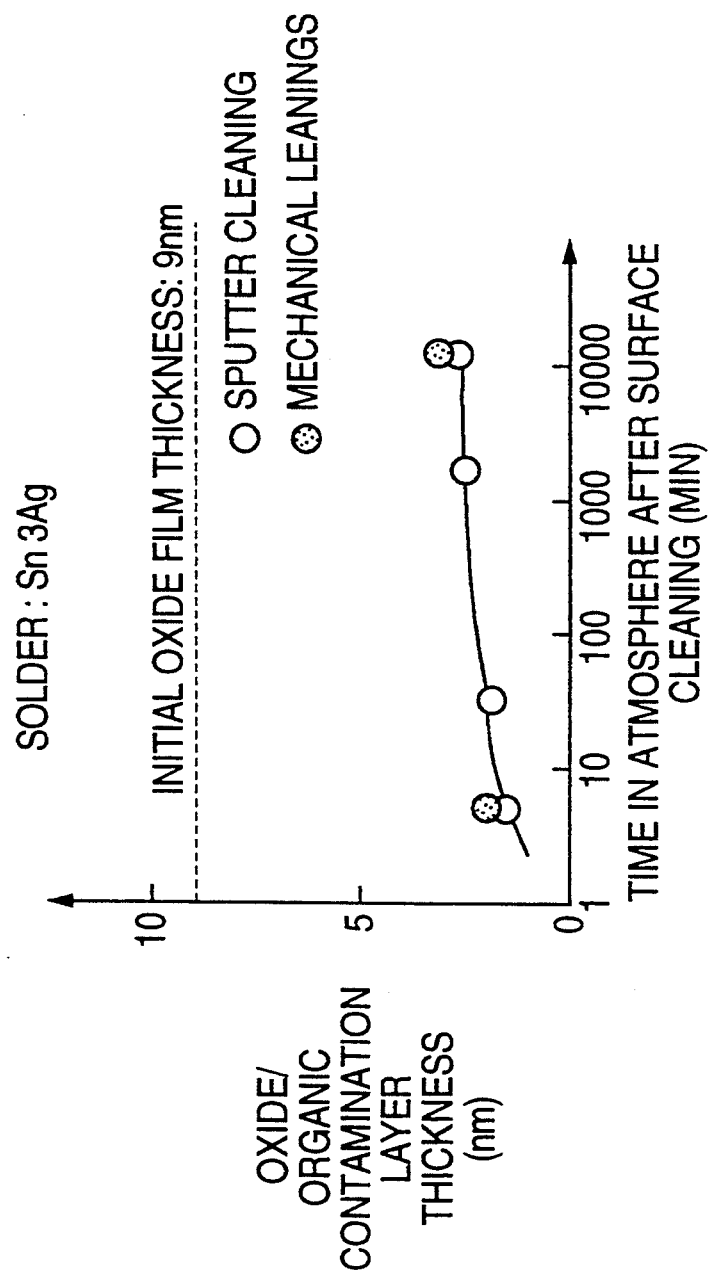

METHOD OF FABRICATING ELECTRONIC CIRCUIT DEVICE AND APPARATUS FOR PERFORMING THE SAME METHOD

This application is a continuation-in-part of application Ser. No. 656,465, filed Feb. 19, 1991, and now abandoned.

BACKGROUND OF THE INVENTION

The present invention relates to a method and an apparatus for fabricating an electronic circuit device and particularly, to a method of soldering at least two different materials or members of such circuit device without using flux. The present invention further relates to a solder ball to be used therein and to a alignment mark for aligning the members to be connected.

When two different materials or members are to be soldered together, it is usual to use flux or cream containing flux to remove oxide films formed on surfaces of such members, maintain these surfaces clean by preventing oxidation thereof and promote wettability of solder on these surfaces. However, when such flux or flux-containing cream is used, there is a tendency of void generation due to evaporation of flux in soldering operation, as illustrated in FIG. 1, which causes strength and hence reliability of soldered junction to be lowered.

Further, in such conventional technique, there is an environmental pollution problem, particularly, such as destruction of ozone layer, due to removal of flux since flux must be washed out by using organic solvent such as chloric solvent or freon after the soldering is completed. Further, it is very difficult to completely wash out flux although not impossible.

In order to solve such problem, a low residual, low activity flux requiring no washing operation has been proposed. Since, however, such low activity flux is easily oxized when heated in atmosphere, a soldering operation has to be done in a belt furnace filled with $N_2$. Such furnace is partitioned by four shutters into an inlet gas purge chamber, a heating, melting and bonding chamber in which air is substituted by $N_2$ to maintain oxygen concentration in the second chamber as low as about 70 ppm and an outlet gas purge chamber.

Since, although this bonding method is easy to use, it has inherent problems mentioned above, fluxless soldering using ion beam has been proposed in J. Vacuum Science Technology, 20(3), March 1982, pp 359–363. In a case of soldering without flux, in order to prevent oxide film from growing on a solder surface after being cleaned by sputtering, an alignment of members to be soldered and soldering material and a heating of soldering material must be performed in non-oxidizing atmosphere which is not practical in views of facility therefor which is large and complicated and technical difficulties of alignment of members itself in such facility.

For example, Japanese Kokai(P) 58-3238 discloses a fluxless soldering method in which two members to be bonded are juxtaposed in a vacuum chamber with solder surfaces thereof being upside, cleaned by ion irradiation, aligned by overlapping them and then irradiated with ion beam to melt it.

Since, in this method, the cleaning, aligning and heating operations are all performed within the vacuum chamber, workability and producibility are very low. Particularly, in the aligning step, an alignment device must be provided within the vacuum chamber, for picking at least one of the members up, turning it over, carrying it onto the other member and aligning a number of bonding portions thereof. This means that the size of the vacuum chamber becomes large causing cost of the whole apparatus to be increased, efficiency to be low and possibility of contamination of the vacuum chamber to be high. Further, due to the use of ion beam, there is a limit in thermal capacity thereof causing simultaneous heating of large substrates to be difficult.

As another example, Japanese Kokai(P) 3-171643 discloses a method in which an atom or ion beam irradiation device and a post processing device for aligning bonding portions and heating solder are separately provided. An interior of the post processing device is filled with inert gas. Two members to be bonded are aligned in a prenum chamber of the post processing device and heated to temperature lower than melting point of solder under pressure to temporarily fix them and transported to a heating/melting chamber of the post processing device to perform soldering.

Although this method is advantageous in that the aligning device is not required in the ion beam irradiation device, the post processing device must be kept of vacuum pressure and the alignment and soldering operations must be done therein.

In recent computer, etc., a number of fine connections using fine solder balls for the so-called flip-chip connection are required. It has been very difficult to bond a number of parts each including such number of connections within an inert atmosphere in such vacuum chamber with high alignment. Further, transportation of such parts with respect to the vacuum chamber and evacuation thereof, etc., are troublesome, causing workability to be low.

SUMMARY OF THE INVENTION

For each solder ball to be used in such flip-chip connection, there is a thick oxide film 6 or organic-contamination layer on the surface of the soldering material 2 as shown in FIG. 2a. If the soldering material is heated to perform a soldering operation in non-oxidizing atmosphere such as $H_2/N_2$ or $N_2$ without sputter-cleaning of such oxide film, etc., wettability of soldering material, formation of spherical configuration of soldering material and self-alignment thereof due to surface tension thereof are not enough as illustrated in FIGS. 2b and 2c.

Therefore, an object of the present invention is to provide a method of soldering members without using flux.

Another object of the present invention is to provide such fluxless soldering method in which an alignment of members can be performed in an atmospheric, oxidizing environment.

Another object of the present invention is to provide a solder ball suitable in fluxless soldering.

A further object of the present invention is to provide an alignment mark for facilitating alignment of bonding portions of two members, which is effective in fluxless soldering.

In order to achieve the above mentioned objects, according to the present invention, contaminated and/or oxidized surfaces of member or members to be soldered and soldering material are sputter-cleaned with atom or ion and, after an alignment of the members is performed in an oxidizing atmosphere, a soldering operation is performed in non-oxidizing atmosphere. Alternatively, such surfaces may be cleaned mechanically, such as polishing, cutting, etc.

A time for which the aligning operation in such atmospheric or oxidizing environment is possible is defined by a re-oxidation and re-contamination characteristics of solder material.

A fluxless soldering apparatus according to the present invention comprises means for removing oxide film of solder, means for aligning bonding portions of connecting members in an atmospheric environment and heating means for soldering the bonding portions in an non-oxidizing or reducing atmosphere.

Further, the apparatus comprises evacuation means for evacuating an interior of the heating means, means provided in the heating means for supplying non-oxidizing gas such as $N_2$, Ar or He or any mixture thereof or reducing gas such as a mixture of $H_2$ and $N_2$ into the interior and control means for controlling concentration of the gas.

The heating means is partitioned into a prenum chamber, heating and soldering chamber having a belt furnace for heating solder of the connecting members and a cooling chamber for cooling the soldered members, each chamber including a vacuum system and a gas supply system, through which a belt conveyer passes. Gate valves are provided between atmosphere and the prenum chamber, between adjacent chambers and between the cooling chamber and atmosphere, respectively, to communicate between them.

The prenum chamber is evacuated with or without heating to remove water content or other gas component adsorbed in the members to be connected to prevent concentration of required gas in the heating and soldering chamber from being lowered.

Further, a sputter cleaning device is provided for removing oxide film and/or contaminated surface of the bonding portions of the electronic circuit and/or solder by means of atom or ion beam. Alternatively, a mechanical device may be used for removal of oxide film or contaminated surface of the solder and/or the connecting members.

Solder balls may be gold-plated. Gold-plating may be performed after reducing the surfaces thereof with diluted acid solution. In this case, the oxide film removing step may be omitted.

The alignment of the two members is performed in an atmospheric environment by using alignment mark means which comprises a protrusion formed on each bonding portion of one of the two members and a recess formed in a protrusion formed on a corresponding bonding portion of the other member to receive the protrusion of the one member. At least a portion of each protrusion is formed of a solder ball melt bonded thereto or refractive resin material.

BRIEF DESCRIPTION OF THE DRAWINGS

FIG. 9 is a graph showing an example of soldering along the steps shown in FIG. 3;

FIG. 13 is a perspective view of a substrate and a roof plate;

FIGS. 14(a)-14(f) show steps for soldering a frame of a roof plate to a substrate, according to the present invention;

FIG. 15 illustrates a method of mechanically removing oxide film on a solder surface, according to the present invention;

FIG. 18 is a relation of oxide film thickness of a solder ball to time in atmospheric environment;

DETAILED DESCRIPTION OF THE PREFERRED EMBODIMENTS

Preferred embodiments of the present invention will be described with reference to FIGS. 3 to 5.

Figure 1A:
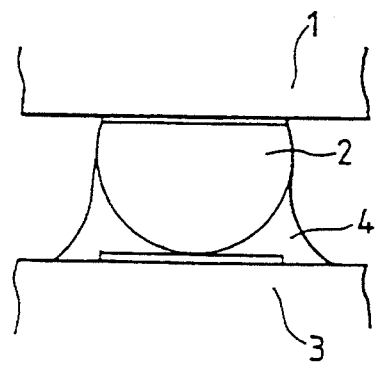
FIGS. 1(a)-1(c) are cross sections showing a soldering according to a conventional method.
Figure 1B:
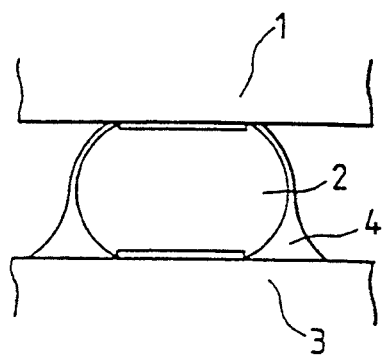
Figure 1C:
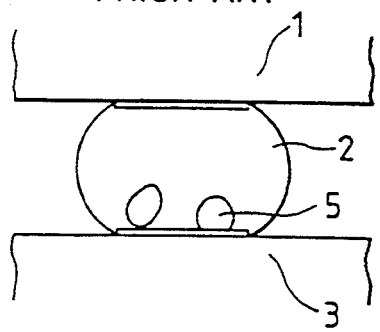
Figure 2A:
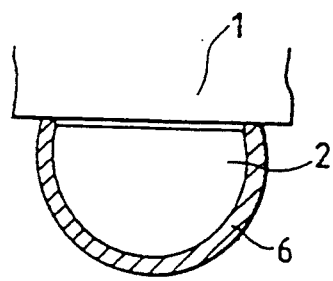
FIGS. 2(a)-2(c) are cross sections showing a soldering obtained by soldering without flux while surface of soldering material is not sputter-cleaned.
Figure 2B:
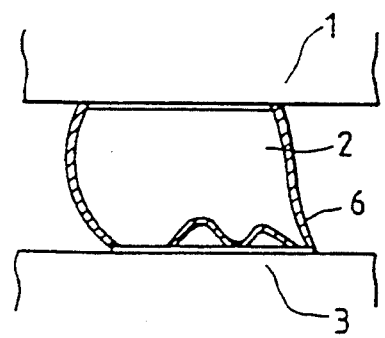
Figure 2C:
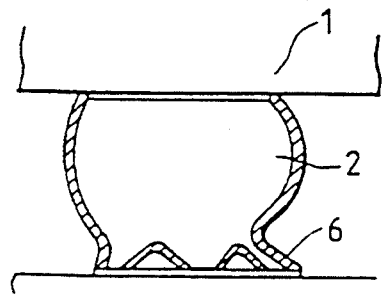
Figure 3A:
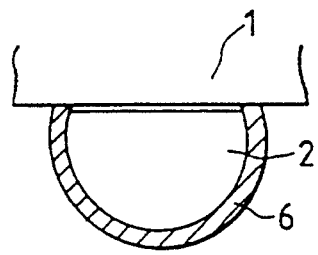
FIGS. 3(a)-3(e) are cross sections showing a soldering obtained without flux after solder surface is sputter-cleaned, according to the principle of the present invention.
Figure 3B:
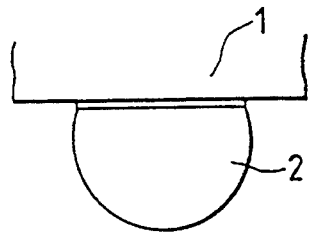
Figure 3C:
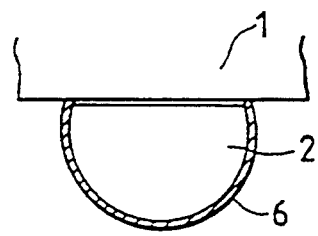
Figure 3D:
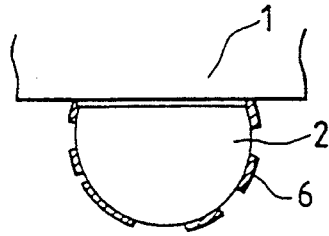
Figure 3E:
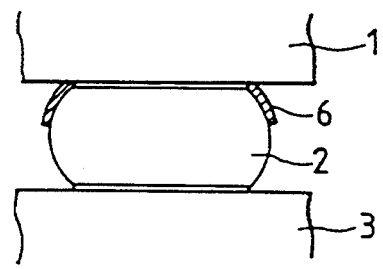

According to the present invention, the problem caused by a thick oxide film, etc., on the soldering material is solved as shown in FIGS. 3a to 3e. That is, a surface of the soldering material on which a thick oxide film 6 is formed as shown in FIG. 3a is sputter-cleaned to remove the oxide film 6 as shown in FIG. 3b. After the sputter-cleaning, an oxide film 6 may be formed again as shown in FIG. 3c, which may be thin enough compared with that before the sputter-cleaning. By heating the soldering material 2 in non-oxidizing atmosphere, the soldering material is expanded to segment the thin film 6 to thereby exposed clean surface portions a shown in FIG. 3d. In this state a soldering is performed without flux, resulting in the state shown in FIG. 3e in which the soldering material wets on a surface of a member which may be metalized to be soldered, resulting in a desirable junction.

The removal of the initial thick oxide film or contamination on the surfaces of the members to be soldered and the soldering material can be performed by sputter-cleaning with atom or ion.

Further, by heating and melting the soldering material in non-oxidizing atmosphere, it is possible to prevent the solder surface from being re-oxidized to thereby maintain it clean and keep the wettability thereof high enough.

Since the aligning operation can be done in oxidizing atmosphere, the facility therefor may be simple and aligning operation itself is easy.

A time within which the non-flux soldering can be done with good result even if there is re-oxidation or re-contamination of soldering material surface is determined from a time dependency of thickness of re-oxidized film.

FIG. 4 illustrates a first embodiment of the present invention using this principle and applied to a formation of a ceramic substrate 3 of a semiconductor integrated circuit 1. It was intended to solder the semiconductor integrated circuit 1 to a metalization pad 8 formed by baking molybdenum or tungsten on the ceramic substrate 3 and then plating it with nickel and the gold, with using a Pb5Sn soldering material 9.

Figure 4A:
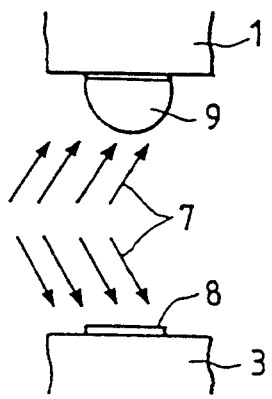
FIGS. 4(a)-4(d) are cross sections showing a soldering of a semiconductor integrated circuit onto a ceramic substrate, according to an embodiment of the present invention.
Figure 4B:
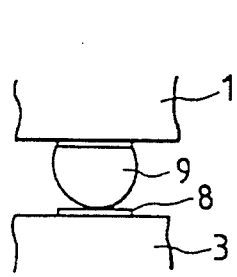
Figure 4C:
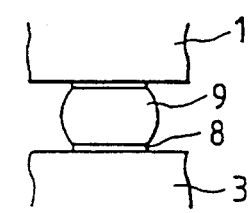
Figure 4D:
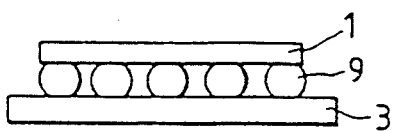

As shown in FIG. 4a, the Pb5Sn solder 9 and each metalization pad 8 were sputter-cleaned with argon atom 7 to remove oxide film and/or organic contamination layer thereon. Then as shown in FIG. 4b after a positional alignment thereof was performed in oxidizing atmosphere within a certain time T, in this case, thirty minutes, they were put in a $H_2/N_2$ furnace ($H_2 : N_2 = 1 : 1$ or $1 : 3$) until the soldering material was heated and melted. It has been found that a good soldering is obtained without using flux, as shown in FIG. 4c. FIG. 4d shows a whole configulation of the result of soldering.

An experiment was conducted to determine the time T for which the members to be soldered and the soldering material can be handled in oxidizing atmosphere for alignment purpose without detrimental effect on a resultant soldering, by performing the same procedure as mentioned above with changing the alignment time T from 1 hour to 8 hours with 1 hour increment. The result shows that soldering in which the alignment time T is equal to or shorter than 5 hours exhibits a good junction, while, for the time T of 8 hours, the shape of soldering material is not spherical though a good junction is obtained. Therefore, the time in the order of 8 hours may be an upper limit for good soldering.

Figure 5A:
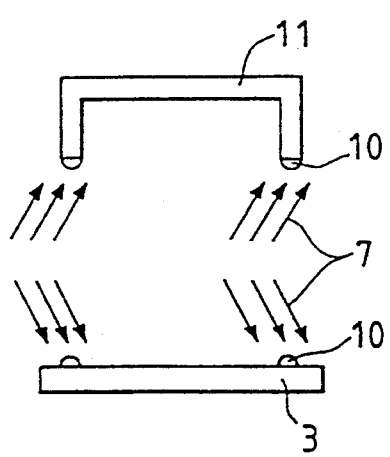
FIGS. 5(a)-5(c) are cross sections showing a soldering of a sealing cap onto a ceramic substrate, according to another embodiment of the present invention.
Figure 5B:
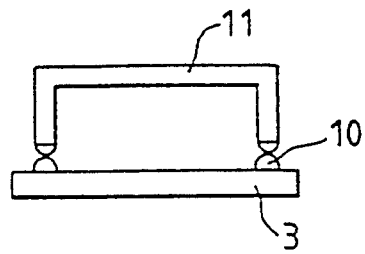
Figure 5C:
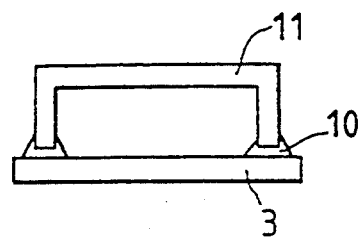

FIG. 5 shows another embodiment of the present invention in which a cap 11 of A1N is soldered to a ceramic substrate 3 with a Sn37Pb solder 10 to form a sealed structure. As shown in FIG. 5a, the cap 11 and the ceramic substrate 3 on which solders 10 were disposed are sputter-cleaned with argon atom 7 to remove oxide films or contaminated layers thereon. Then, as shown in FIG. 5b, after an alignment procedure was performed in thirty minutes in oxidizing atmosphere, they were put in a $H_2/N_2$ furnace so that the solder 10 was melted and a soldering was performed without using flux. It has been found that a favorable junction is obtained as shown in FIG. 5c. A similar experiment was conducted to determine the time T for which the members to be soldered and the soldering material can be handled in oxidizing atmosphere for alignment purpose without detrimental effect on a resultant soldering, by performing the same procedure as mentioned above with changing the alignment time T from 1 hour to 8 hours with 1 hour increment. The result shows that soldering in which the alignment time T is equal to or shorter than 5 hours exhibits a good solder junction, while, for the time T of 8 hours, the shape of solder junction is not spherical though a good solder junction is obtained. Therefore, the time in the order of 8 hours may be a limit for good soldering.

It should be noted that the soldering material is applied to the member 1 or 11 to be soldered in the same way to that to the other member 3 without using flux.

As to the soldering material which can be used in the present invention without flux, it has been found that other Pb and Sn alloy solders having different constituent ratio than Pb5Sn and Sn37Pb and other solder materials belonging to Sn, Ag alloys, Au, Sn alloys, Au, Ge alloys and Au, Si alloys are also acceptable.

As is clear from the foregoing description, in order to perform the aligning operation between members having a large thermal capacity and the soldering operation thereof easily with a simple facility, it should be done with using the operations in oxidizing atmosphere and the conventional non-oxidizing furnace.

Figure 6:
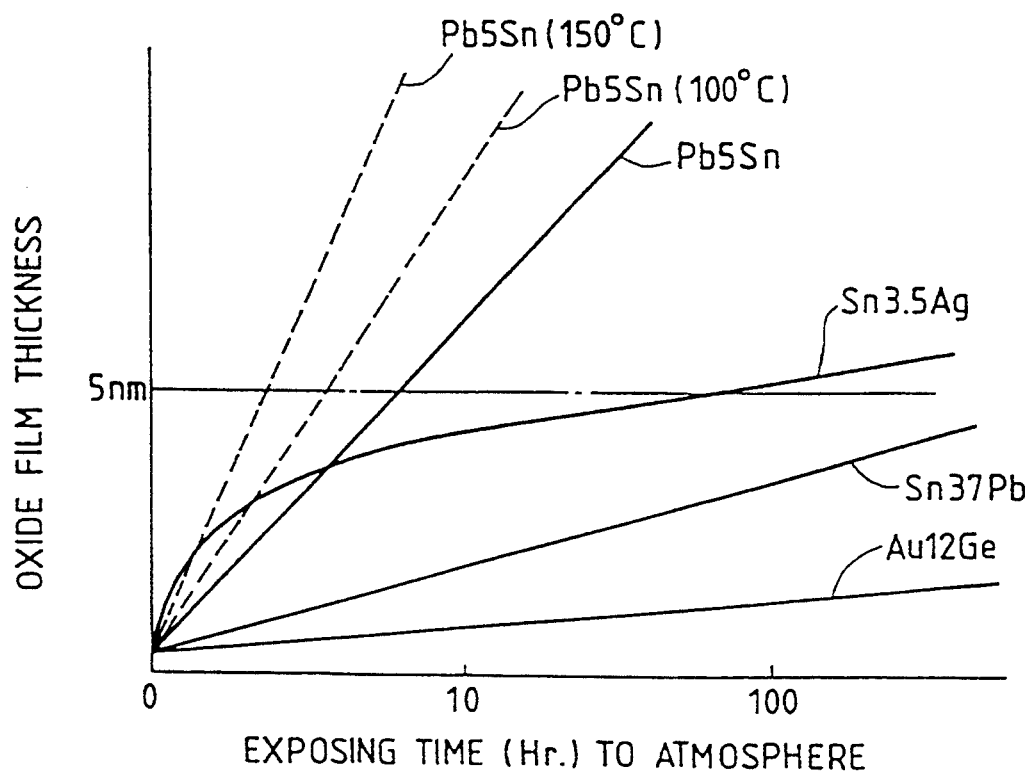
FIG. 6 is a graph showing relation between an exposing time to oxidizing atmosphere and oxide film thickness of various soldering materials, after sputter-cleaning.

FIG. 6 shows oxidation characteristics of soldering material with time at room temperature, in view of permissible oxide film thickness which may be about 5 nm. The upper limit of exposing time to oxidizing atmosphere with respect to oxidation can be obtained qualitatively from a relation between the time and the oxide thickness, which is about 6 hours or more which is substantially coincident with the result obtained with respect to the embodiments shown in FIGS. 4 and 5. Further, as shown by dotted lines in FIG. 6 which correspond to Pb5Sn at 150° C. and 100° C., the growing speed of oxide film increases with temperature. Therefore, the exposing time to oxidizing atmosphere should be made shorter with increase of temperature.

It has been found that, in order to solder the members with soldering material having re-oxidized film whose thickness is that obtained after the sputter-cleaning, the soldering material should satisfy the following conditions: that is, minimum void, good wettability for the member to be soldered, resultant shape soldering material corresponding to a shape defined by surface tension thereof, a self-alignment function to correct any deviation during soldering and high reliability (T~, high temperature strength. where ~ is the number of cycles). Soldering junctions obtained by the present invention ($H_2/N_2$ atmosphere) and by the conventional method (without sputter-cleaning, with and without flux) are shown in the following table 1.

TABLE 1

| solder | wett-ability (>100%) | void | shape | self-align | temp. cycle (T~test for −55 to +150° C., after 1000~) |
|---|---|---|---|---|---|
| INVENTION ($H_2/N_2$ FURNACE) | | | | | |
| 1.Pb2Sn | O | small | O | O | O |
| 2.Pb5Sn | O | small | O | O | O |
| 3.Pb10Sn | O | small | O | O | O |
| 4.Sn37Pb | O | small | O | O | O |
| 5.Sn3.5Ag | O | small | O | O | O |
| 6.Au12Ge | O | small | O | O | — |
| PRIOR ART ($N_2$ FURNACE) | | | | | |
| FLUX | | | | | |

TABLE 1-continued

| solder | wett-ability (>100%) | void | shape | self-align | temp. cycle (T~test for −55 to +150° C., after 1000~) |
|---|---|---|---|---|---|
| 1.Pb2Sn | O | large | O | O | Δ (2) |
| 2.Pb5Sn | O | large | O | O | Δ (3) |
| 3.Sn37Pb | O | large | O | O | Δ (5) |
| 4.Sn3.5Ag | O | large | O | O | Δ (2) |
| NON-FLUX | | | | | |
| 5.Pb5Sn | X | small | X | X | — |
| 6.Sn3.5Ag | X | small | X | X | — |
| 7.Au12Ge | X | small | Δ | Δ | — |

Note: O denotes good results, Δ denotes not good but acceptable result and X denotes bad result. The number in parenthesis in the temperature cycle column for the conventional method with flux depicts the number of damaged junctions among 20 junctions tested.

The junction obtained by the present method exhibits good characteristics similar to that obtained by the conventional method using flux in wettability, shape and self-alignment. As to void, it is very small. This may be due to non-use of flux. As to the temperature cycle duration, that according to the present invention is better than that obtainable by the conventional method using flux. The conventional method using no flux exhibits worse results in all of the terms. The same results are obtained for other inert gas furnace such as Ar furnace, He furnace, $N_2$ furnace and fluorocarbon (e.g., freon) vapor furnace. However, in these furnaces, oxygen concentration should be restricted to about 10 ppm or lower. Further, it should be noted that it is also possible to use an active, or reducing gas furnace such as $H_2/N_2$ or $H_2$ gas.

Although the present invention has been described with reference to specific applications, it can be applied to other electronic circuits and parts such as LSI packages with the same effects.

As mentioned hereinbefore, according to the present soldering method which does not use flux, aligning works of the circuits or parts which are to be soldered and may have large thermal capacity can be done in oxidizing atmosphere. Therefore, the workability is much improved with using a simple facility providing no pollution and thus realizing a reliable soldering economically.

Figure 7:
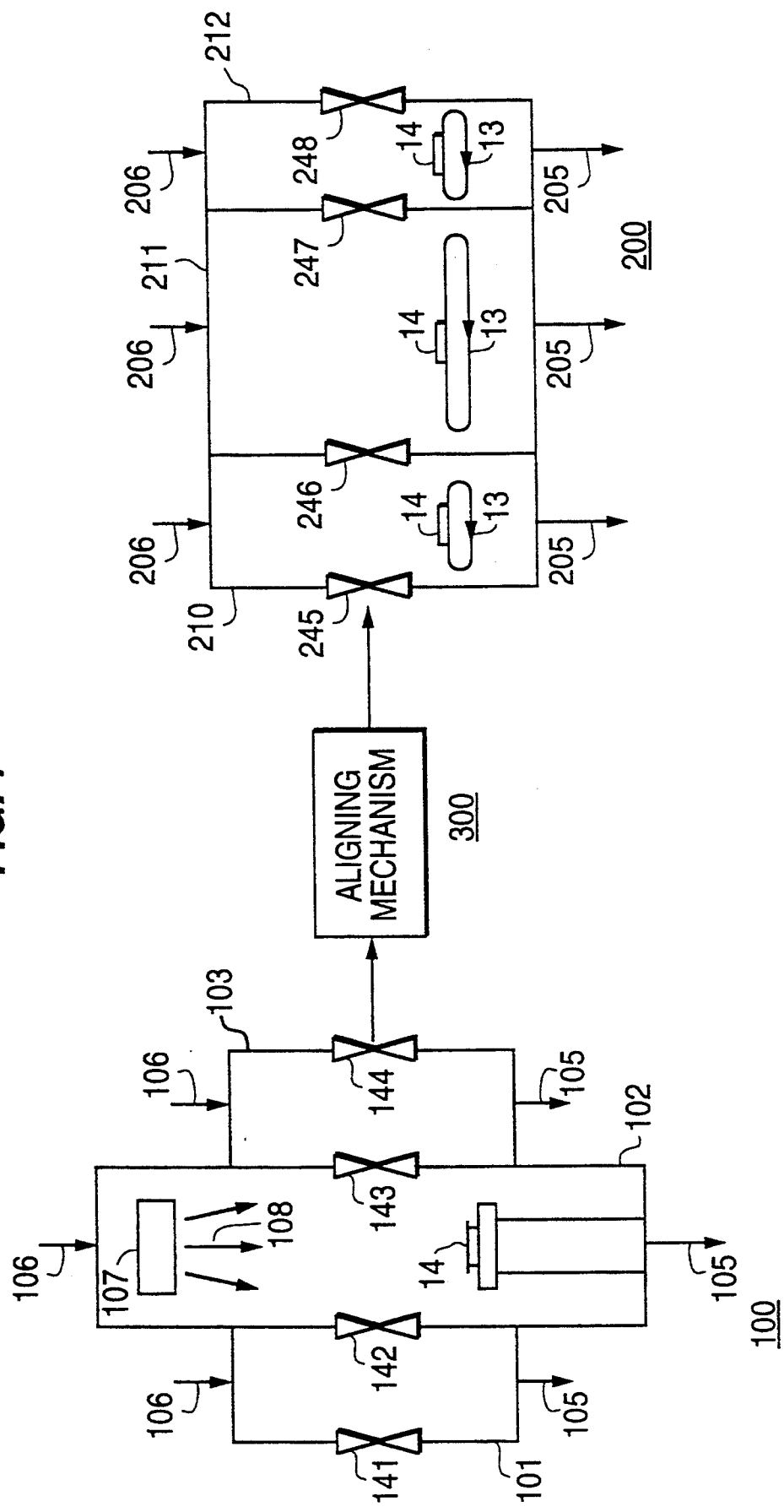
FIG. 7 is a block diagram showing a soldering apparatus according to an embodiment of the present invention.

FIG. 7 shows a construction of a fluxless soldering apparatus according to an embodiment of the present invention. In FIG. 7, the apparatus comprises a sputter-cleaning device 100 and a belt furnace 200, between which an alignment mechanism 300 is provided. The sputter-cleaning device 100 includes a prenum cheer 101, a cleaning chamber 102 and an outlet chamber 103, all of which are evacuated and between adjacent ones of which gate valves 141 to 144 are provided.

Each chamber is associated with a evacuating system 105 and a gas introducing system 106 and, in both the prenum chamber 101 and the outlet chamber 103, gas purge is performed by evacuation and subsequent communication to atmosphere.

In the cleaning chamber 102, evacuation and gas supply to a gun 107 provided therein to emit ion and/or atom are performed.

Solder portions, that is, solder balls and connecting pads, etc., of a member 14 transported into the sputter-cleaning device 100 as to be bonded together are irradiated with ion and/or atom to remove oxide films and/or organic contamination films.

The cleaning chamber 102 can treat a plurality of mutually connected connecting members simultaneously.

The member 14 thus cleaned is transported to the alignment mechanism 300 and after alignment transported to the belt furnace 200.

The transportation of the member 14 from the sputter cleaning device 100 through the alignment mechanism 300 to the belt furnace 200 is continuously performed by means of belt conveyors.

The belt furnace 200 is comprised of a prenum chamber 210, a heating and welding chamber 211 and a cooling chamber 212, all of which can be evacuated and adjacent ones of which are connected by gate valves 245 to 248.

Each chamber of the belt furnace 200 is equipped with an evacuating system 205 and a gas introducing system 206 and is purged by evacuation and subsequent introduction of non-oxidizing gas.

The member 14 transported into the belt furnace 200 is transported through the respective chambers 210, 211 and 212 by belt conveyors 13 provided therein, respectively.

Figure 8:
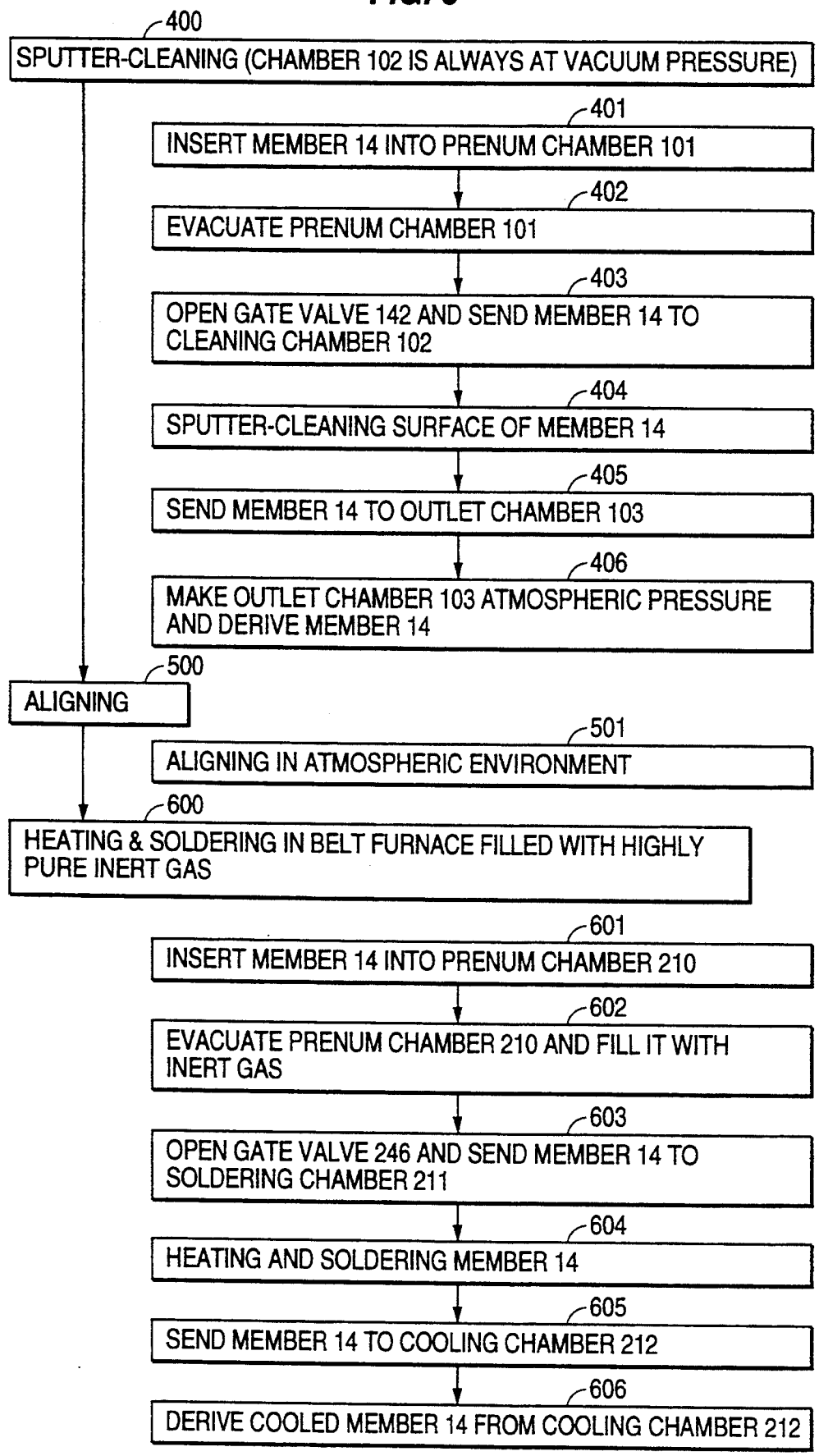
FIG. 8 is a flowchart showing an operation of the apparatus shown in FIG. 7.

FIG. 8 shows a flowchart of a fluxless soldering operation by means of the apparatus shown in FIG. 7. In an initial stage, all of the gate valves 141 to 144 and 245 to 248 are closed.

In FIG. 8, a step of removing oxide film and/or organic contaminating film on bonding pads of the member 14 and on the solder portions to be performed by the sputter cleaning device 100 is shown by 400. The step 400 includes steps 401 to 406. The cleaning chamber 102 is continuously evacuated so that vacuum pressure higher than $10^{-5}$ Torr is maintained therein.

In the step 401, the gate valve 141 of an inlet of the prenum chamber 101 of the sputter cleaning device 100 is opened to convey the member 14 having solder balls at predetermined positions thereof thereinto. In the step 402, the prenum chamber 101 is evacuated. When an amount of gas and/or water content adsorbed by the member 14 is much, heating is performed additionally simultaneously with the evacuation of the prenum chamber 101, to thereby prevent vacuum condition in the subsequent cleaning chamber 102 from being degraded. It may be possible to reduce a processing time in the cleaning chamber by providing a baking device in front of the prenum chamber 101. The baking device may perform evacuation and heating.

Then, in the step 403, the gate valve 141 between the prenum chamber 101 and the cleaning chamber 102 is opened so that the member 14 is transported into the cleaning chamber 102. Thereafter, the gate valve 145 is closed. Then, in the step 404, the member 14 in the cleaning chamber 102 is irradiated with ion and/or atom beam 108 from the gun 107 while being rotated to remove undesired films on the solder balls and the connecting pads therefrom.

In the step 405, the outlet side gate valve 143 of the cleaning chamber 102 is opened and thus cleaned member 14 is transported into the outlet chamber 103 maintained at vacuum pressure and then the latter gate valve 143 is closed.

Thereafter, in the step 406, the outlet chamber 103 is made atmospheric pressure and its outlet side gate valve 144 is opened so that the member 14 can be derived therefrom.

Then, in the step 500, an alignment between two members 14 thus processed is performed by means of the alignment mechanism 300 in atmospheric environment.

Then, in the step 600, the fluxless soldering is performed by the belt furnace 200. The step 600 includes steps 601 to 606. It should be noted that the interior of the heating and welding chamber 211 is continuously maintained with a non-oxidizing atmosphere by evacuation and subsequent introduction of non-oxidizing gas.

In the step 601, the inlet side gate valve 245 of the prenum chamber 210 is opened through which the aligned members 14 are introduced thereinto. In the step 602, the prenum chamber 210 is evacuated and then filled with non-oxidizing gas.

Then, in the step 603, the gate valve 246 between the prenum chamber 210 and the heating and soldering chamber 211 is opened to move the members 14 to the latter and, in the step 604, the gate valve 246 is closed and heating of the bonding portions of the members 14 is performed.

Thereafter, in the step 605, the gate valve 247 between the heating and soldering chamber 211 and the cooling chamber 212 is opened, so that the soldered members 14 are transported to the cooling chamber 212. After cooling, in the step 606, the cooling chamber 212 is made atmospheric pressure and then the members 14 are derived therefrom through the gate valve 248 opened at that time.

Concentration of non-oxidizing gas in the heating and soldering chamber 211 can be selected arbitrarily on the basis of vacuum pressure to be established therein and concentration of inert gas to be introduced thereinto. Therefore, the apparatus of this invention can be used suitably for fluxless soldering of any combination of solder material and members to be bonded thereby.

When a solder material such as containing Sn which exhibits superior wettability is used, the prenum chamber 210 and the cooling chamber 212 may be omitted and the heating and soldering chamber 211 may be filled with inert gas such as $N_2$, Ar or He.

Further, it is possible to further restrict oxygen concentration by introducing $H_2$ into the inert gas and allowing reaction between $H_2$ thus introduced and residual Alternatively, it may be possible to remove the evacuation systems of the belt furnace and instead use a belt furnace in which atmospheric gas therein is substituted by such inert gas.

FIG. 9 shows, by a solid line, a variation of thickness of oxide film on the solder ball 2 along states shown in FIG. 3 when the solder ball is of Sn3.5Ag (MCC/CCB) in $H_2/N_2$ (=1:1) atmosphere and the solder ball bonds a ceramic chip 1 to a substrate 3. As shown, the initial oxide film thickness of about 10 nm in the initial state shown in FIG. 3(a) is reduced to almost zero in the sputtering state shown in FIG. 3(b) and then gradually increases to about 2–3 nm until heating. By heating, the oxide film 6 is fractured to expose clean surface by which bonding is performed. Thereafter, the thickness increases. A chain line in FIG. 9 shows thickness of oxide film when the present invention is not applied.

FIG. 10 shows an example of a method for welding solder balls to pads of such as LSI or substrate.

Figure 10A:
FIG. 10 illustrates steps of welding solder balls to a printed circuit board.
Figure 10B:
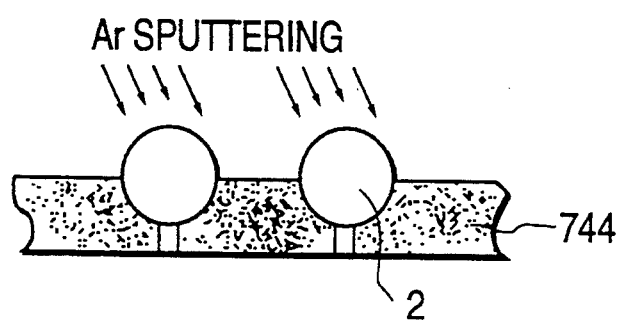

First, as shown in FIG. 10(a), a positioning plate 744 of such as glass fiber which has recesses at respective solder balls 2 is prepared. A number of solder balls 2 are supplied onto the plate 744 and received in the respective recesses by vibrating the plate and held therein stably by applying negative pressure behind the balls, as shown in FIG. 10(b). These solder balls in the recesses are irradiated with such as Ar atom beam to remove oxide films thereon.

Figure 10C:
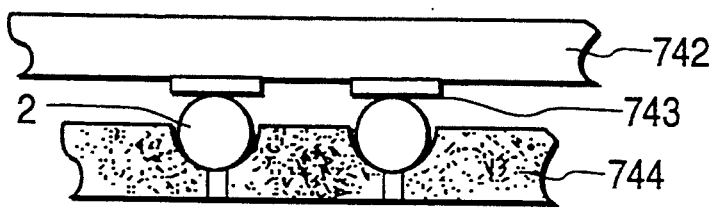
Figure 10D:
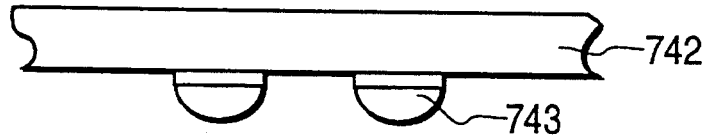

Then, as shown in FIG. 10(c), a printed circuit board 742 is put thereon with alignment between these solder balls and pads 743 of the circuit board 742 and, by heating them, the solder balls are welded to the respective pads as shown in FIG. 10(d).

Figure 11:
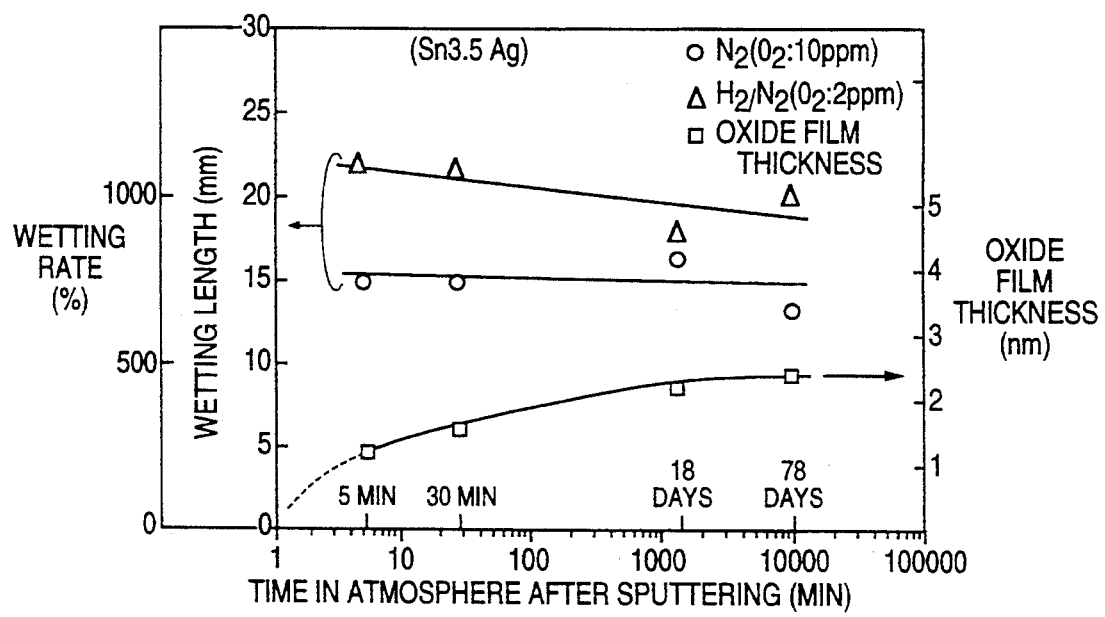
FIG. 11 is a graph showing details of oxide film thickness and soldering characteristics of solder ball with time for which the latter is put in atmospheric environment.

FIG. 11 shows curves represented by square mark, triangle mark and round mark. The curve having square mark shows a variation of oxide thickness on a solder pellet of Sn3.5Ag put in atmosphere after being sputter cleaned, plotted with time, and the curves having round mark and triangle mark show wetting rate and wetting length of solder when identical solder pellets are welded to pad surfaces similarly sputter-cleaned in the belt furnace 200 shown in FIG. 7 with using $N_2$ and $H_2/N_2$ as gas filling the furnace, respectively.

As is clear from FIG. 11, the thickness of oxide film on the solder becomes 1 nm within several minutes after being put in an atmospheric environment and never increases beyond 2 to 3 nm even after several days. As mentioned previously with respect to FIG. 3, it is possible to perform, with satisfactory result, the heating and soldering process in the belt furnace so long as the oxide film thickness is not more than 2 to 3 nm. Further, from FIG. 11, it is clear that although the wetting length and wetting rate characteristics are reduced slightly with time for which it is put in atmospheric environment, the wettability thereof is still acceptable even after 7 days.

Since it can be said from FIG. 11 that it takes much more time when the thickness becomes 5 nm which may be practical upper limit, there is no need of limiting the time for which the solder material can be put in atmospheric condition after being sputter-cleaned.

Figure 12:
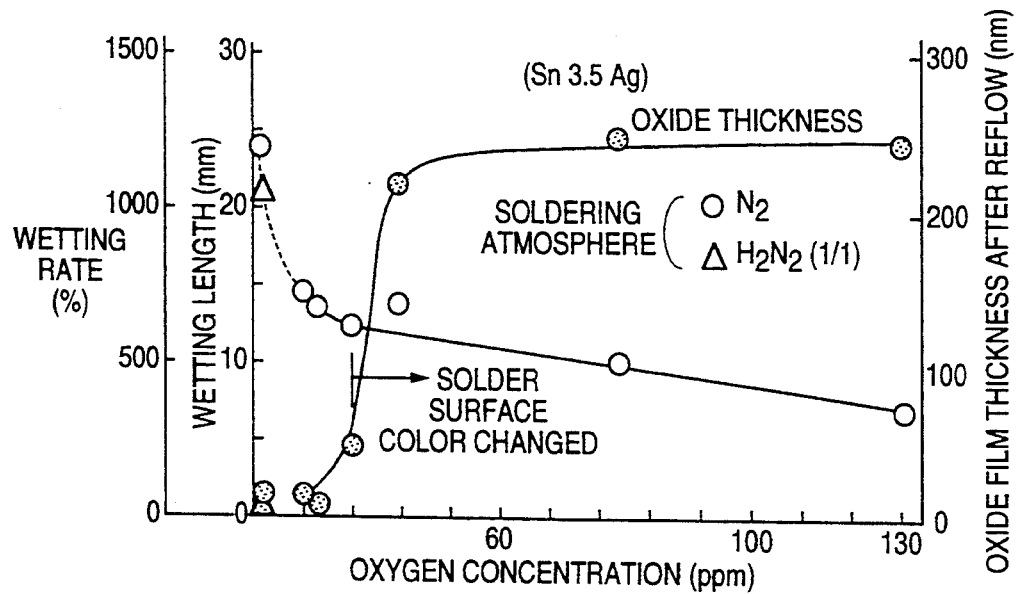
FIG. 12 is a graph showing a relation between oxygen concentration during soldering and oxide film thickness and soldering characteristics of the solder ball.

FIG. 12 shows plots of the thickness of oxide film on the solder ball of Sn3.5Ag and the wetting rate and the wetting length thereof when soldered in the belt furnace 200 with respect to oxygen concentration in the furnace.

When oxygen concentration exceeds 20 ppm, the oxide film thickness increases abruptly beyond 20 nm. Further, the wetting rate and wetting length are reduced remarkably until oxygen concentration reaches 20 ppm. Beyond 20 ppm, solder surface changed its color to light violet and became useless practically.

Now an embodiment of the present invention will be described with reference to FIG. 13, in which a roof plate 747 having a frame 746 is bonded to a substrate 742 having metallized portion 745.

As shown in FIG. 14(a), the metallized portion 745 and a solder 21 are sputtered with Ar ion and the solder 21 whose oxide film is thus removed is put on the metallized portion 745 as shown in FIG. 14(b). Then, as shown in FIG. 14(c), the solder 21 is melted in non-oxidizing atmosphere.

Thereafter, the frame 746 and the solder 21 on the metallized portion 745 are ion-sputtered again as shown in FIG. 14(d), the frame 746 is aligned with the metallized portion 745 as shown in FIG. 14(e) and then they are soldered in non-oxidizing atmosphere as shown in FIG. 14(f).

FIG. 15 illustrates another embodiment of oxide film removal according to the present invention. Instead of sputter-cleaning of oxide film, this embodiment shows a mechanical oxide film removing. In FIG. 15, a solder 21 is formed as a rod having rectangular cross section or circular cross section. Such solder rod is passed through a corresponding die 30 having cross section smaller than that of the solder rod. Similarly, the oxide film removal shown in FIG. 3 may be performed by polishing or cutting a top portion of the solder ball 2. Further, the mechanical oxide film removal can be used in combination with the sputter-cleaning.

FIG. 16 illustrates a method of welding solder balls 2 to pads 743 on a mechanically polished substrate 742.

Figure 16A:
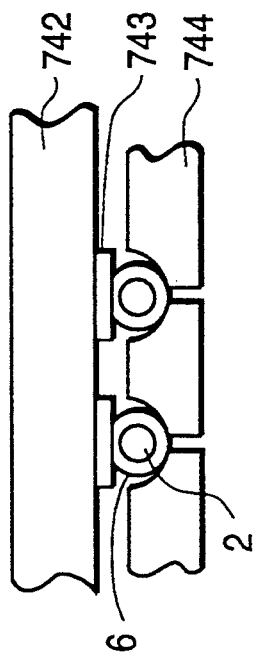
FIG. 16 illustrates steps for removing oxide film on solder ball mechanically and soldering it onto a substrate, according to the present invention.
Figure 16B:
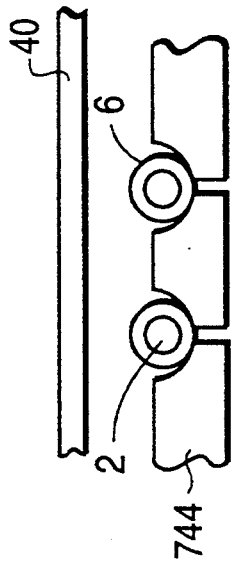

As shown in FIG. 16(a), the solder balls 2 are put in recesses of a positioning plate 744 of such as glass fiber and held therein stably as in the case shown in FIG. 10, and top portions thereof are polished by moving or vibrating a polishing cloth 40 in lateral directions. Then, as shown in FIG. 16(b), the pads 743 on the substrate 742 are put on the solder balls 2 whose top portions are polished and heated in non-oxidizing atmosphere.

Figure 17A:
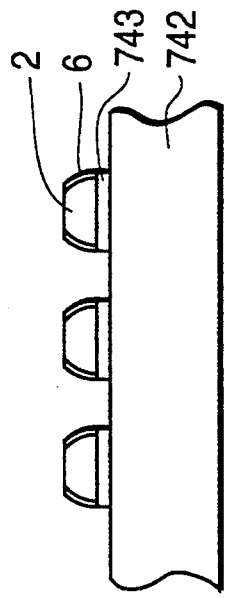
FIG. 17 illustrates a mechanical removal of oxide film on a solder ball on a substrate, according to the present invention.
Figure 17B:
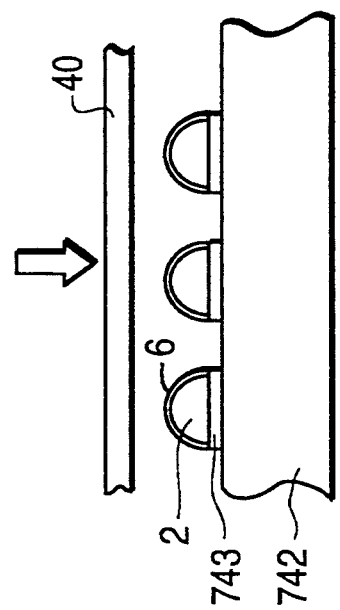

FIG. 17 illustrates a mechanical polishing method of top portions of solder balls 2 welded to pads 743 on a substrate 742. As shown in FIG. 17(a), the top portions thereof are polished by moving or vibrating a polishing cloth 40 in lateral directions. Thus, oxide films 6 on the top portions of the solder balls 2 are removed and solder material is exposed as shown in FIG. 17(b). By welding the exposed portions of the solder balls 2 to the pads 743 in non-oxidizing atmosphere, satisfactory bonding can be obtained.

FIG. 18 is a plot of thickness of oxide film formed on a solder material when put in atmospheric condition after mechanically polished as shown in FIG. 15, 16 or 17, together with data obtained by sputter-cleaning for comparison purpose.

A curve represented by black circle mark shows the data resulting from the mechanical polishing and a curve represented by white circle mark shows data obtained by sputter cleaning. There is no significant difference therebetween.

In the respective embodiments described hereinbefore, it is the object to remove oxide film on solder material by sputtering or mechanical polishing.

It is possible to omit such sputter cleaning process or mechanical polishing process, if solder surface is preliminarily processed suitably.

Figure 19A:
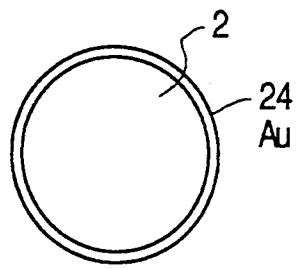
FIGS. 19(a)-19(e) show steps of welding gold-plated solder ball to a substrate or parts, etc.

FIG. 19(a) shows a surface of solder ball 2 which is plated with gold 24.

Figure 19B:
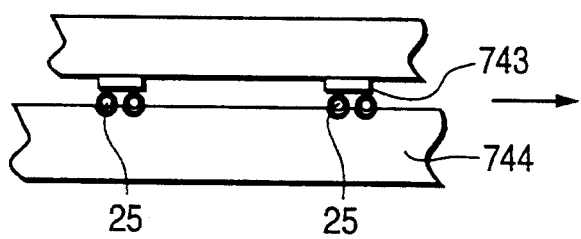
Figure 19C:
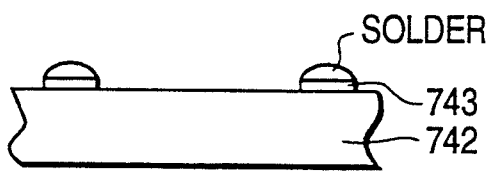

The gold-plated solder balls 2 are put in recesses of a plate 744 and a substrate 742 is put on these solder balls 2 through pads 743 thereof and heated as shown in FIG. 19(b), the balls can be welded to the pads as shown in FIG. 19(c).

Figure 19D:
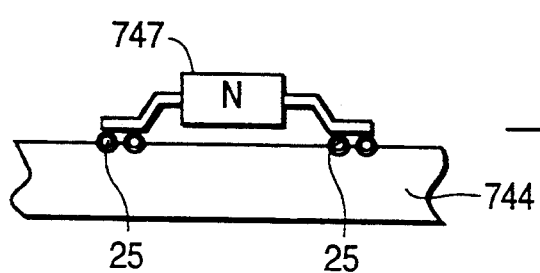
Figure 19E:
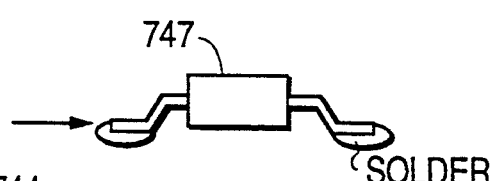

Similarly, as shown in FIGS. 19(d) and 19(e), it is possible to weld such solder balls to lead lines of respective parts 747. In such case, the pads 743 and/or the lead lines of such parts 747 may be sputter cleaned or mechanically cleaned or gold-plated.

The gold layer 24 on the solder ball 2 can be formed by, for example, a barrel plating technique. In such barrel plating, solder balls 2 put in a plating cage are dipped in plating liquid and plated while steering the liquid.

Solder ball iself may be formed by using atomizing technique or oil tank method.

In such atomizing method in which melt solder dropping in non-oxidizing atmosphere becomes small particles by surface tension, solder particles solidified are separated depending upon their size.

In the oil tank method, a predetermined amount of solder pellets are thrown into an oil tank, oil therein being heated to a temperature not lower than melting point of the pellet. The pellets are melted in a surface portion of oil and sink to a lower portion of the tank, temperature of which is lower than that of the surface portion, while becoming round particles by surface tension and solidified.

Since solder balls thus formed have an oxide film thereon already, they are reduced in diluted acid solution and then plated with gold in the barrel plating tank.

In the fluxless soldering apparatus shown in FIG. 7, the alignment of two members to be bonded together by solder balls is performed in the alignment mechanism 300. In this mechanism, the two men, hers aligned with each other are not temporarily fixed to each other. Therefore, there is a risk that these two members are misaligned due to vibration experienced during transportation to the belt furnace 200 and/or transportation thereof within the belt furnace.

FIGS. 20 to 23 show alignment means for facilitating alignment of two members and preventing misalignment of these members after being aligned.

Figure 20A:
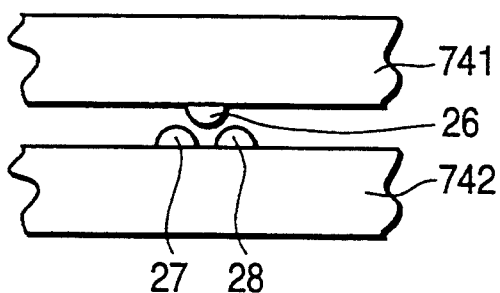
FIGS. 20(a) and 20(b), 21(a) and 21(b), 22(a) and 22(b) and 23 are cross sections illustrating alignment according to the present invention.
Figure 20B:
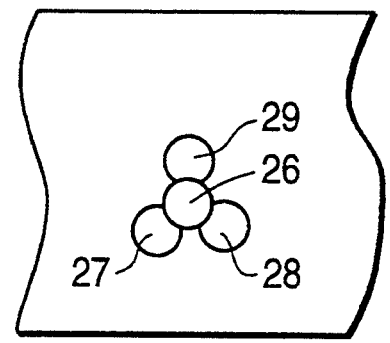

As shown in FIG. 20(a), a solder ball 26 is provided as a protrusion on a member 741 to be soldered to a member 742 and a plurality of such solder balls are provided as protrusion means on a corresponding portion of the member 742. In this embodiment, three solder balls 27 to 29 are provided at respective apices of a triangle forming the protrusion means having a central space as shown in FIG. 20(b). The positioning of the member 741 to the member 742 is performed by putting the solder ball 26 in the center of the triangularly arranged solder balls 27 to 29.

Since the solder ball 26 is dropped in the center of the triangle natuarally, there is no deviation between them and the accuracy of alignment therebetween in putting them together can be improved compared with the conventional scheme.

By providing at least two of such combinations of solder balls, the members 741 and 742 can be aligned exactly.

Preferably, the respectice solder balls are isolated electrically from wirings of an electronic circuit associated with the members to be bonded.

Figure 21A:
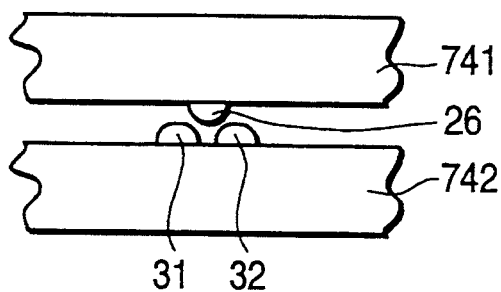
Figure 21B:
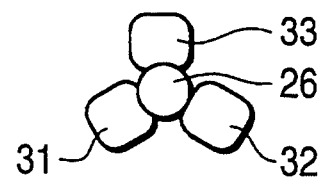

FIG. 21 shows another embodiment of the alignment in which the solder balls 27 to 29 are replaced by protrusions 31 to 33. The effect thereof is substantially the same as that obtained by the solder balls 27 to 29.

The protrusions 31 to 33 are of material such as PIQ resin which may be hardly melted at a soldering temperature or, if melted, has viscosity enough to prevent any mutual deviation between the members.

Figure 22A:
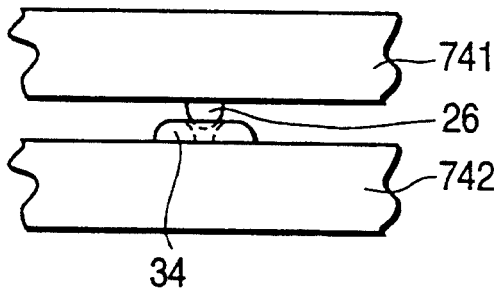
Figure 22B:
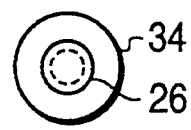

FIG. 22 shows another embodiment in which, instead of the solder balls 27–29 or the protrusiions 31-33, ring shaped protrusions 34 of solder material or such resin as mentioned are used. Each ring has a center recess in which a solder ball is received. Other modifications of this alignment mark are possible so long as they prevent mutual deviation of the members to be bonded.

When there is an area given which is large enough for alignment, solder balls for bonding may be used for the purpose instead of such alignment mark.

Figure 23:
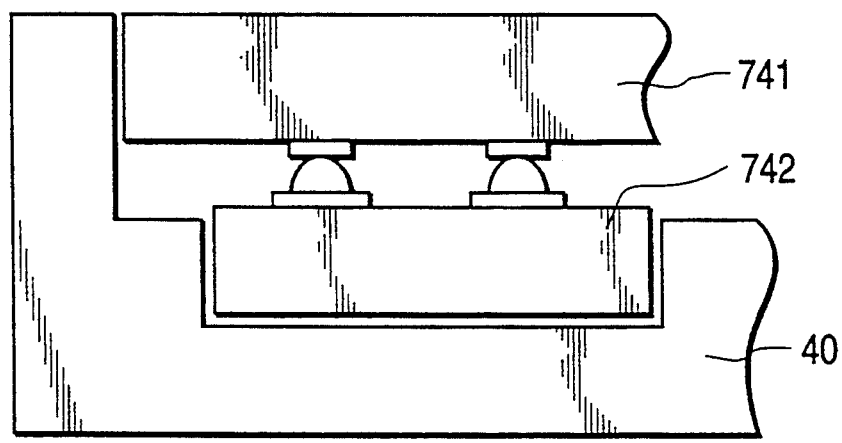

Further, it is possible to keep two members 741 and 742 in aligned state by means of a jig 40 as shown in FIG. 23.

While the present invention has been particularly shown and described with reference to the preferred embodiments thereof, it will be understood by those skilled in the art that the foregoing and other modifications in form and details may be made therein without departing from the spirit and scope of the present invention.

What is claimed is:

1. A method of soldering for use in fabricating an electronic circuit device, comprising the steps of:
   removing at least one of an oxide layer and contamination layer both from a surface of a soldering material and from a surface of members to be soldered thereby, by sputter-cleaning with at least one of atom and ion;
   aligning said members in an oxidizing atmosphere; and
   heating said soldering material and performing a soldering operation in a non-oxidizing atmosphere.

2. A method of soldering for use in fabricating an electric circuit device, comprising the steps of:
   removing at least one of an oxide layer and a contamination layer from surfaces of a soldering material and members to be soldered thereby, by sputter-cleaning with at least one of atom or ion;
   supplying oxygen to said surfaces to form thin oxide films thereon;
   aligning said members; and
   heating said soldering material and performing a soldering operation in a non-oxidizing atmosphere.

3. The method claimed in claim 1 or 2, wherein said soldering material is at least one selected from a group consisting of alloys of Pb and Sn, alloys of Sn and Ag, alloys of Au and Sn, alloys of Au and Ge and alloys of Au and Si, and wherein said aligning step in an oxidizing atmosphere is performed for at most six hours.

4. The method claimed in claim 2, wherein said non-oxidizing atmosphere is inert gas.

5. The method claimed in claim 4, wherein said non-oxidizing atmosphere is He.

6. The method claimed in claim 4, wherein said non-oxidizing atmosphere is argon gas.

7. The method claimed in claim 4, wherein said non-oxidizing atmosphere is $N_2$.

8. The method claimed in claim 1 or 2, wherein said non-oxidizing atmosphere is reducing gas.

9. The method claimed in claim 8, wherein said non-oxidizing atmosphere is an active gas atmosphere.

10. The method claimed in claim 9, wherein said active gas atmosphere is selected from the group consisting of (1) a mixture of $H_2$ and $N_2$ and (2) $H_2$.

11. The method claimed in claim 1 or 2, wherein, during said heating, any oxide film formed on the soldering material during the aligning step is segmented so as to expose soldering material during the soldering operation.

12. The method claimed in claim 1 or 2, wherein the aligning in an oxidizing atmosphere is performed for a maximum of 8 hours.

13. The method claimed in claim 1 or 2, wherein the aligning in an oxidizing atmosphere is performed for a time sufficiently limited such that an oxide film formed on the soldering material during the aligning has a thickness of at most 5 nm.

14. The method claimed in claim 1 or 2, wherein two members are joined by said soldering material.

15. The method claimed in claim 1 or 2, wherein said non-oxidizing atmosphere is fluorocarbon vapor.

16. A method of soldering for use in fabricating an electric circuit device, comprising the steps of:
   removing at least one of an oxide layer and a contamination film from surfaces of a solder material and at least one member to be connected thereto;
   aligning said at least one member and said solder material in an oxidizing atmosphere; and
   heating said solder material in a non-oxidizing atmosphere to melt it.

17. The method claimed in claim 16, wherein said solder material has an oxide film of a thickness of at most 5 nm when said solder material is heated in the non-oxidizing atmosphere to melt it.

18. The method claimed in claim 17, wherein said oxide film having a thickness of at most 5 nm is an oxide film formed at least in part during said aligning in an oxidizing atmosphere.

19. A method of soldering for use in fabricating an electric circuit device, comprising the steps of:
   preliminarily processing solder material so as to provide solder material that does not have at least one of an oxide layer and contamination film thereon;
   aligning said solder material and at least one member in an oxidizing atmosphere; and
   heating said solder material in a non-oxidizing atmosphere to melt said solder material and bond said solder material to said at least one member.

20. The method claimed in claim 19, wherein said preliminary processing includes providing solder balls each plated with gold.

21. The method claimed in claim 20, wherein the solder material and two members are aligned in the oxidizing atmosphere, and in the heating step the solder material is melted so as to bond the two members to each other.

22. The method claimed in claim 19, wherein said preliminary processing includes removing at least one of oxide layer and contamination layer from surface of said solder material.

23. A fluxless bonding method for bonding connecting members of an integrated circuit, comprising the steps of:
   removing at least one of oxide film and contamination film on at least one of said connecting members and a solder material;
   aligning said connecting members is an oxidizing atmosphere; and
   heating said solder material in a non-oxidizing atmosphere to melt it.

24. The method claimed in claim 23, wherein said non-oxidizing atmosphere is prepared by supplying non-oxidizing gas to a vacuum atmosphere.

25. The method claimed in claim 24, wherein said non-oxidizing gas is inert gas selected from the group consisting of $N_2$, Ar and He and a mixture thereof, and wherein said atmosphere during the heating is controlled by controlling said vacuum pressure and concentration of said gas.

26. The method claimed in claim 27, wherein said non-oxidizing atmosphere is a mixture of $H_2$ and $N_2$ and wherein said non-oxidizing atmosphere during the heating is controlled by controlling concentration of said mixture.

27. The method claimed in any one of claims 23 to 26, further comprising the steps of:
   preliminarily evacuating a prenum chamber, equipped with a vacuum system and gas supply system each having a gate valve, and having said connecting members therein;

heating and melting said connecting members in a belt furnace equipped with a vacuum system and a gas supply system each having a gate valve; and cooling said connecting members in a cooling chamber.

28. The method claimed in any one of claims 23 to 26, wherein said step of removing at least one of oxide film and contamination film of at least one of said connecting members and said solder material is performed by sputter-cleaning using at least one of atom and ion beam irradiation.

29. The method claimed in any one of claims 23 to 26, wherein said step of removing at least one of oxide film and contamination film of at least one of said connecting members and said solder material is performed mechanically.

30. The method claimed in any one of claims 23 to 26, wherein said step of removing is performed mechanically.

31. The method claimed in any one of claims 23 to 26, wherein said step of aligning is performed by fitting protrusions formed on one of said connecting members in recesses formed in protrusion means formed on another connecting member.

32. The method claimed in claim 23, wherein said step of aligning is performed by fitting protrusions formed on one of said connecting members in recesses formed in protrusion means formed on another connecting member.

33. The method claimed in claim 32, wherein at least one of (a) protrusion and (b) at least a portion of said protrusion means is formed of a refractive resin.

34. The method claimed in claim 32, wherein at least one of (a) said protrusion and (b) at least a portion of said protrusion means is formed from at least one solder ball welded to said members.

* * * * *